United States Patent
Wang et al.

(10) Patent No.: US 11,340,473 B2
(45) Date of Patent: May 24, 2022

(54) 3D DISPLAY PANEL, METHOD FOR DRIVING SAME, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanfeng Wang, Beijing (CN); Dan Wang, Beijing (CN); Yun Qiu, Beijing (CN); Zhidong Wang, Beijing (CN); Xiaoling Xu, Beijing (CN); Yuanxin Du, Beijing (CN); Zhenhua Lv, Beijing (CN); Congcong Wei, Beijing (CN); Weipin Hu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 882 days.

(21) Appl. No.: 16/067,318

(22) PCT Filed: Dec. 11, 2017

(86) PCT No.: PCT/CN2017/115437
§ 371 (c)(1),
(2) Date: Jun. 29, 2018

(87) PCT Pub. No.: WO2018/176910
PCT Pub. Date: Oct. 4, 2018

(65) Prior Publication Data
US 2021/0211639 A1  Jul. 8, 2021

(30) Foreign Application Priority Data
Apr. 1, 2017  (CN) .......................... 201720342386.3

(51) Int. Cl.
*H04N 13/31* (2018.01)
*G02B 30/28* (2020.01)
(Continued)

(52) U.S. Cl.
CPC ............. *G02B 30/28* (2020.01); *G02B 30/33* (2020.01); *G02F 1/294* (2021.01); *H01L 25/167* (2013.01);
(Continued)

(58) Field of Classification Search
CPC ................ G02B 30/30; G02B 27/2214; H04N 13/0409; G09G 3/003
(Continued)

(56) References Cited

U.S. PATENT DOCUMENTS

2007/0236619 A1  10/2007  Kuo
2012/0306859 A1* 12/2012  Eom ...................... G09G 3/003
                                                     345/419
(Continued)

FOREIGN PATENT DOCUMENTS

CN  102231840 A  2/2011
CN  102231840 A  11/2011
(Continued)

OTHER PUBLICATIONS

European Extended Search Report dated Jan. 14, 2021 corresponding to application No. 17901330.5-1020.
(Continued)

*Primary Examiner* — Yuzhen Shen
(74) *Attorney, Agent, or Firm* — Nath, Goldberg & Meyer; Joshua B. Goldberg

(57) ABSTRACT

The present disclosure belongs to the field of display technology, and particularly relates to a 3D display panel, a method for driving the same and a display apparatus. The 3D display panel is divided into a plurality of pixel regions and
(Continued)

comprises a light emitting unit, and the light emitting unit includes a plurality of light emitting devices arranged in the plurality of pixel regions. The plurality of light emitting devices are configured to form a barrier pattern of alternating bright and dark bands during display of the 3D display panel.

16 Claims, 4 Drawing Sheets

(51) Int. Cl.
*H04N 13/32* (2018.01)
*G02F 1/29* (2006.01)
*H01L 25/16* (2006.01)
*G02B 30/33* (2020.01)

(52) U.S. Cl.
CPC ............. *H04N 13/31* (2018.05); *H04N 13/32* (2018.05); *G02F 2201/122* (2013.01); *G02F 2201/18* (2013.01); *G02F 2203/34* (2013.01)

(58) Field of Classification Search
USPC ................................ 348/51; 349/15; 345/419
See application file for complete search history.

(56) References Cited

U.S. PATENT DOCUMENTS

| | | | | |
|---|---|---|---|---|
| 2012/0307181 | A1* | 12/2012 | Fang | G02F 1/133606 349/64 |
| 2015/0029584 | A1 | 1/2015 | Song et al. | |
| 2015/0362741 | A1* | 12/2015 | Oh | G02F 1/13394 349/15 |
| 2016/0139422 | A1* | 5/2016 | Sumi | G02B 27/0093 349/15 |
| 2016/0161823 | A1* | 6/2016 | Kim | H04N 13/373 349/15 |
| 2017/0213934 | A1* | 7/2017 | Grundmann | H01L 33/24 |
| 2017/0214906 | A1* | 7/2017 | Yang | H04N 13/398 |
| 2017/0242161 | A1* | 8/2017 | Zhang | G02B 3/0037 |
| 2018/0190678 | A1* | 7/2018 | Ahmed | H01L 27/1225 |
| 2019/0027642 | A1* | 1/2019 | Zou | H01L 33/48 |

FOREIGN PATENT DOCUMENTS

| | | | | |
|---|---|---|---|---|
| CN | 102256147 | A | | 11/2011 |
| CN | 102722022 | A | | 10/2012 |
| CN | 102736335 | A | | 10/2012 |
| CN | 103278969 | A | | 9/2013 |
| CN | 105093547 | A * | 11/2015 | ............. H04N 13/30 |
| CN | 105319775 | A | | 2/2016 |
| CN | 106125323 | A | | 11/2016 |
| JP | 2016012071 | A | | 1/2016 |
| WO | 2017028439 | A1 | | 2/2017 |

OTHER PUBLICATIONS

International search report dated Mar. 8, 2018 for corresponding application No. PCT/CN2017/115437 with English translation attached.

* cited by examiner

3D DISPLAY PANEL, METHOD FOR DRIVING SAME, AND DISPLAY APPARATUS

CROSS-REFERENCE TO RELATED APPLICATION

This is a National Phase Application filed under 35 U.S.C. 371 as a national stage of PCT/CN2017/115437, filed Dec. 11, 2017, an application claiming the benefit of Chinese Application No. 201720342386.3, filed Apr. 1, 2017, the content of each of which is hereby incorporated by reference in its entirety.

TECHNICAL FIELD

The present disclosure relates to the field of display technology, and particularly relates to a 3D display panel, a method for driving the same, and a display apparatus including the 3D display panel.

BACKGROUND

Three-dimensional (3D) display technology has become a development trend in the display field. At present, 3D display technology is generally implemented using the binocular parallax principle. That is, two parallax images (i.e., left and right parallax images) are displayed on a two-dimensional display screen, and then a certain technique is adopted such that the left and right eyes of a viewer can only see the left and right parallax images on the screen, respectively.

SUMMARY

The present disclosure provides a 3D display panel and a display apparatus, and the 3D display panel is substantially free of crosstalk and has good controllability.

In one aspect, the present disclosure provides a 3D display panel, which is divided into a plurality of pixel regions and includes a light emitting unit, wherein the light emitting unit includes a plurality of light emitting devices arranged in an array and respectively in the plurality of pixel regions, and the plurality of light emitting devices are configured to form a barrier pattern of alternating bright and dark bands during display of the 3D display panel.

Optionally, the 3D display panel further includes a display adjustment unit configured to control an exit direction of light emitted from the plurality of light emitting devices.

Optionally, the display adjustment unit includes a display adjustment layer and a control electrode layer disposed on at least one side of the display adjustment layer, wherein:
the display adjustment layer is a liquid crystal layer; and
the control electrode layer includes a plurality of control electrodes spaced apart from each other, and the plurality of control electrodes are configured to drive liquid crystal in the liquid crystal layer to form a plurality of liquid crystal lenses under the action of voltages applied to the plurality of control electrodes, and adjust sizes and curvatures of the plurality of liquid crystal lenses by controlling the voltages applied to the plurality of control electrodes, so as to control the exit direction of the light emitted from the plurality of light emitting devices.

Optionally, the plurality of liquid crystal lenses are in one-to-one correspondence with the plurality of light emitting devices.

Optionally, the plurality of control electrodes each are strip-shaped, the plurality of control electrodes are symmetrically disposed on two sides of the display adjustment layer, and the control electrodes and the light emitting devices are disposed correspondingly.

Optionally, the plurality of control electrodes each are strip-shaped, the plurality of control electrodes are disposed at intervals on a single side of the display adjustment layer, and at least part of the control electrodes are disposed correspondingly to the light emitting devices.

Optionally, the 3D display panel further includes a first controller, the plurality of control electrodes are led, through electrode lines, to a peripheral region of the display panel to be connected to the first controller, and the first controller is configured to control a voltage applied to each of the plurality of control electrodes such that the liquid crystal in the liquid crystal layer forms a plurality of liquid crystal lenses, and the sizes and curvatures of the plurality of liquid crystal lenses are adjusted.

Optionally, the 3D display panel further includes a second controller, the plurality of light emitting devices are led, through electrode lines, to the peripheral region of the display panel to be connected to the second controller, and the second controller is configured to control the plurality of light emitting devices in the plurality of pixel regions to form a barrier pattern of alternating bright and dark bands.

Optionally, the liquid crystal layer is made of a twisted nematic liquid crystal, or an electrically controlled birefringence liquid crystal.

Optionally, the 3D display panel further includes a plurality of gate lines and a plurality of data lines intersecting with each other and disposed between adjacent pixel regions, and each of the plurality of light emitting devices is connected to one of the plurality of gate lines and one of the plurality of data lines.

Optionally, the light emitting devices are micro light emitting diodes.

Optionally, the micro light emitting diodes are monochromatic light emitting diodes having different colors, and the micro light emitting diodes having different colors are cyclically arranged in a row direction and a column direction.

Optionally, the micro light emitting diodes are white light emitting diode devices.

Optionally, the micro light emitting diodes are formed by a transfer method.

Optionally, the micro light emitting diodes are formed on any one of a glass substrate, a polyester film substrate, and a printed circuit board.

In another aspect, the present disclosure provides a method for driving the above-described 3D display panel, including:
driving the plurality of light emitting devices row by row or column by column such that the plurality of light emitting devices form a barrier pattern of alternating bright and dark bands.

Optionally, the plurality of light emitting devices are driven by a controller row by row or column by column such that the plurality of light emitting devices form a barrier pattern of alternating bright and dark bands.

In yet another aspect, the present disclosure provides a display apparatus including any one of the 3D display panels described above.

DETAILED DESCRIPTION

To enable those skilled in the art to better understand technical solutions of the present disclosure, the 3D display panel and the display apparatus of the present disclosure will be further described in detail below in conjunction with the accompanying drawings and specific implementations.

The inventors have found that existing LCD (Liquid Crystal Display)-based 3D display devices have problems such as crosstalk between left and right parallax images and poor controllability due to limitations of physical devices, which greatly affects a user's 3D viewing experience.

First Embodiment

The present embodiment provides a 3D display panel, which is substantially free of crosstalk and has good controllability, thus alleviating or solving at least one of the problems such as crosstalk between left and right parallax images and poor controllability due to limitations of physical devices of an existing LCD-based 3D display device.

The 3D display panel is divided into a plurality of pixel regions and includes a light emitting unit. The light emitting unit includes a plurality of light emitting devices arranged in an array and arranged in the plurality of pixel regions, respectively, and the plurality of light emitting devices are configured to form a barrier pattern of alternating bright and dark bands during display.

During display, the light emitting devices in part of rows (columns) are in on state, and the light emitting devices in the other rows (columns) are in off state, thereby forming a barrier pattern of alternating bright and dark bands. In this case, the light emitting devices in off state function as a black matrix (BM), thereby achieving 3D display by means of a parallax barrier.

Optionally, the 3D display panel further includes a display adjustment unit configured to control an exit direction of light emitted from each of the plurality of light emitting devices.

It could be understood that the light emitting unit (the plurality of light emitting devices) is generally disposed below the display adjustment unit (in other words, the display adjustment unit is positioned at the light outgoing side of the light emitting unit), and the light emitting devices generally emit corresponding light according to display data.

Figure 1:
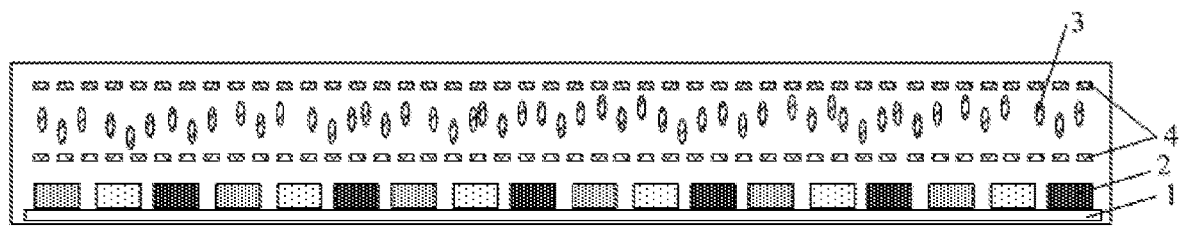
FIG. 1 is a schematic cross-sectional view of a structure of a 3D display panel in an embodiment of the present disclosure.

In some embodiments, the 3D display panel may include a light emitting unit and a display adjustment unit on a substrate 1. As shown in FIG. 1, the display adjustment unit includes a display adjustment layer and a control electrode layer disposed on at least one side of the display adjustment layer, the display adjustment layer is a liquid crystal layer 3, and the control electrode layer includes a plurality of control electrodes 4 spaced apart from each other. By applying a voltage to the control electrode 4, the liquid crystal in the liquid crystal layer 3 can be driven to form a liquid crystal lens under the action of the voltage applied to the control electrode 4, and the size and curvature of the liquid crystal lens can be adjusted by controlling the voltage applied to the control electrode 4. In this way, the exit direction of the light emitted from the light emitting device is controlled.

During display, the light emitting devices in part of rows (columns) are in on state, the light emitting devices in the other rows (columns) are in off state, accordingly, the liquid crystal layer (liquid crystal lenses) corresponding to the light emitting devices in off state is in dark state because no light is transmitted therethrough, while the liquid crystal layer (liquid crystal lenses) corresponding to the light emitting devices in on state operate normally and is in bright state. Therefore, the liquid crystal layer presents a barrier pattern of alternating bright and dark bands, thereby realizing 3D display.

Figure 2:
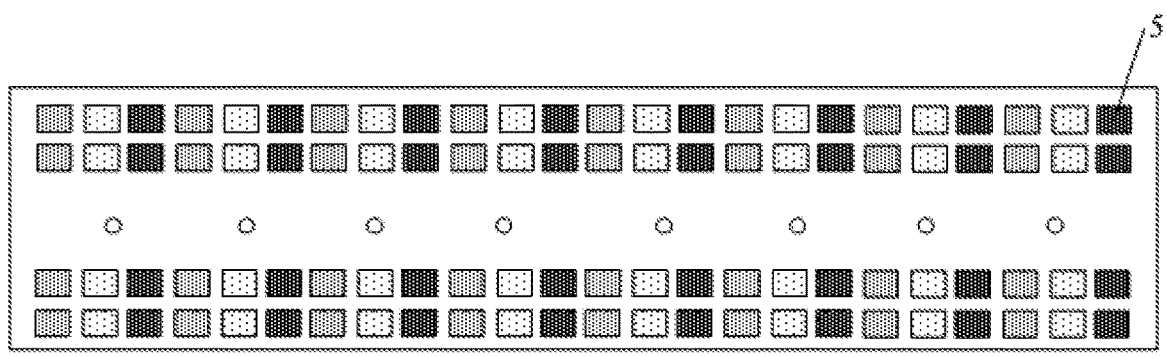
FIG. 2 is a schematic plan view of the 3D display panel in FIG. 1.

The control electrode layer may be symmetrically disposed on both sides of the display adjustment layer, as shown in FIG. 2. In this case, the control electrodes 4 may be strip-shaped, and the plurality of control electrodes 4 and the plurality of light emitting devices 2 are disposed correspondingly such that the formed liquid crystal lenses 31 (refer to FIG. 4A for the liquid crystal lenses 31) are provided in one-to-one correspondence with the light emitting devices 2. In some embodiments, the 3D display panel may include a first controller disposed at a peripheral region of the display panel, and the control electrodes 4 are connected to the first controller through electrode lines. The first controller is configured to control driving voltages applied to the control electrodes 4 to form the liquid crystal lenses 31 and adjust the liquid crystal lenses 31 (e.g., adjust sizes and curvatures thereof). In summary, orientations of the liquid crystal molecules can be controlled by controlling the voltages applied to the control electrodes 4, so that the liquid crystal lenses 31 can be formed in the liquid crystal layer 3, and thus, an exit direction of light emitted from a light emitting device can be controlled through the formed liquid crystal lens 31 corresponding to the light emitting device.

The liquid crystal layer 3 may be made of a twisted nematic (TN) liquid crystal or an electrically controlled birefringence (ECB) liquid crystal. The type of the material of the liquid crystal layer 3 forming the liquid crystal lenses 31 may be flexibly selected as required, and is not limited herein.

Figure 8:
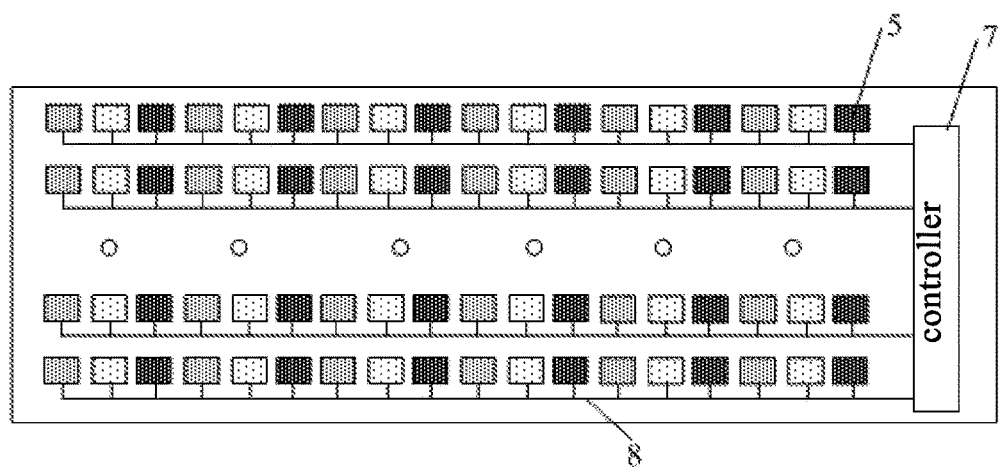
FIG. 8 is a schematic diagram illustrating a connection in which light emitting devices in pixel regions are adjusted to a barrier state in a 3D display panel in an embodiment of the present disclosure.

The 3D display panel may also include a second controller 7 positioned at the periphery region of the display panel. As shown in FIG. 8, the light emitting devices 2 in the pixel regions are connected to the second controller 7 through electrode lines 8. The second controller 7 is configured to control the plurality of light emitting devices 2 in the plurality of pixel regions 5 to form a barrier pattern of alternating bright and dark bands. In one embodiment, the light emitting devices 2 in a same row (or a same column) may be connected to the second controller 7 through a single electrode line 8, so that on/off states of the light emitting devices 2 in one row (or one column) can be controlled by the second controller 7. In this case, the on/off states of the light emitting devices 2 can be controlled row by row (or column by column).

It can be easily understood that the 3D display panel further includes gate lines and data lines intersecting with each other and arranged between adjacent pixel regions 5, each light emitting device 2 is connected to one of the gate lines and one of the data lines, respectively, and control of the light emitting device 2 is realized through the gate line and the data line, so as to achieve display. It can be understood that the light emitting device in off state does not perform display, and only the light emitting device in on state provides corresponding light according to display data.

In the present disclosure, the plurality of light emitting devices 2 may be a plurality of micro light emitting diodes (uLEDs), and the plurality of micro light emitting diodes respectively arranged in the plurality of pixel regions form a uLED array. The uLED array is a microsized two-dimensional array of high density integrated on a single light emitting diode chip epitaxially grown, or a two-dimensional array of microsized light emitting diode chips having high brightness integrated with high density on a single epitaxial substrate, and has a thickness of only a few hundred microns. The micro light emitting diodes are quick in response (refresh rate can reach several kilohertz) and easy to control, thereby ensuring good controllability of the 3D display panel in the embodiment.

As shown in FIG. 2, the micro light emitting diodes may be monochromatic devices, and the micro light emitting diodes having different colors are cyclically arranged in a row direction and a column direction, respectively. For example, the 3D display panel may have a structure (RGB structure) in which red, green, and blue uLEDs are sequentially arranged horizontally and vertically, respectively. Needless to say, the 3D display panel may have a structure with the RGB structure as its core, such as an RGBW structure, an RGBY structure, etc., which is not limited herein. In addition, the red, green, and blue uLEDs in the RGB structure may be arranged in the shape of strip, triangle, mosaic, or the like, which is not limited herein.

Alternatively, the light emitting devices 2 may be white uLEDs. In this case, a corresponding color filter needs to be provided to achieve color display.

Figure 3:
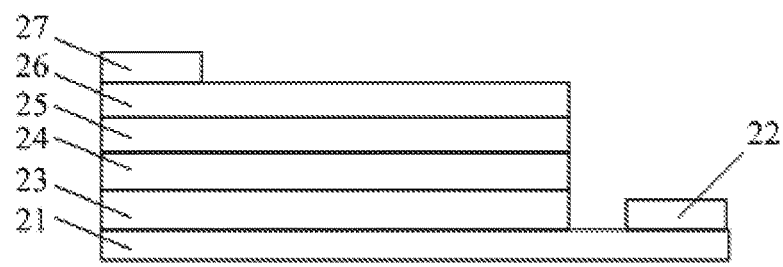
FIG. 3 is a schematic cross-sectional view of a structure of a micro light emitting diode in FIG. 1.

FIG. 3 is a schematic diagram of a structure of a micro light emitting diode. The uLED includes a substrate 21, an N-type electrode 22, an N-type radiative recombination carrier layer 23, a light emitting layer 24, a P-type radiative recombination carrier layer 25, an ohmic contact layer 26, and a P-type electrode 27. Radiative recombination carriers from the N-type radiative recombination carrier layer 23 and the P-type radiative recombination carrier layer 25 radiatively recombine mainly in the light emitting layer 24 to emit light, and the wavelength and intensity of light emitted by the uLED are determined by the light emitting layer 24 and have a great influence on the performances of the product. The micro light emitting diodes may be formed on any one of a glass substrate, a polyester film substrate, and a printed circuit board by a transfer method. After the uLED chip is grown, it is transferred, by a transfer method, to a substrate such as a glass substrate, a PET substrate or a PCB board, on which wiring and a control circuit are provided. The "substrate" herein refers to any kind of substrate, depending on the choice of technology.

It can be seen from the above that the size and curvature of the liquid crystal lens 31 mainly depend on the liquid crystal layer 3 and the control electrode 4, and the process and design of the liquid crystal lens 31 (including the control electrode 4) have micron-order accuracy and can correspond to the accuracy of the micro light emitting diode uLED. Thus, the liquid crystal can easily be controlled to have different refractive indexes by controlling a control voltage applied to the control electrode 4, so as to obtain proper size and curvature of the liquid crystal lens 31, thereby achieving control of light exit direction. The liquid crystal lens 31 is formed based on the uniaxial birefringence property of liquid crystal. Under the condition that the focal length (viewing angle) and the lens radius (the number of viewing angles) are determined, the liquid crystal is selected such that the refractive index difference $\Delta n$ is as large as possible. The refractive index difference $\Delta n$ is fitted to an ideal parabola by applying voltages to the plurality of control electrodes 4, so as to achieve adjustment of the refractive index of the liquid crystal when the polarized light is coplanar with the long axis direction of liquid crystal molecules, thereby realizing adjustment of the size and curvature of the liquid crystal lens 31.

In the 3D display panel, each light emitting device 2 corresponds to one of the liquid crystal lenses 31 during 3D display, the micro light emitting diode has a size of several tens of microns, and the process and design of the liquid crystal lenses 31 also have micron-order accuracy. Display is implemented based on the uLEDs, and micro-level control is achieved through the liquid crystal lenses 31, so that the 3D effect is greatly improved and better 3D experience is realized.

Figure 4A:
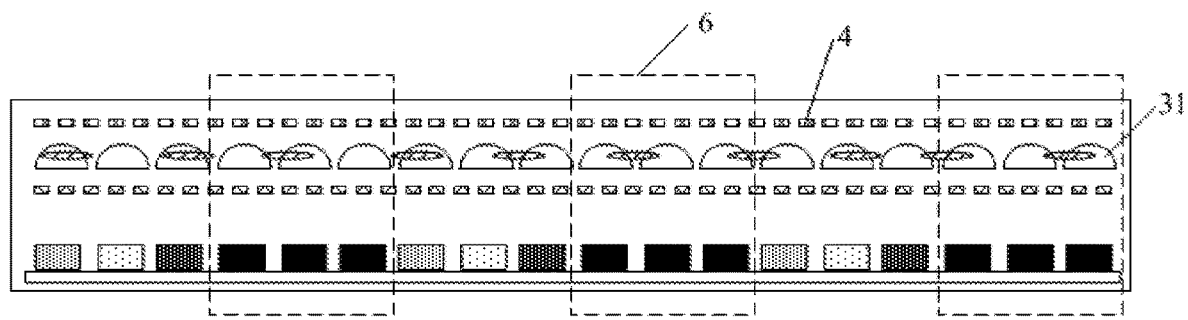
FIG. 4A and FIG. 4B are schematic diagrams illustrating a viewing manner of a 3D display panel in an embodiment of the present disclosure.
Figure 4B:
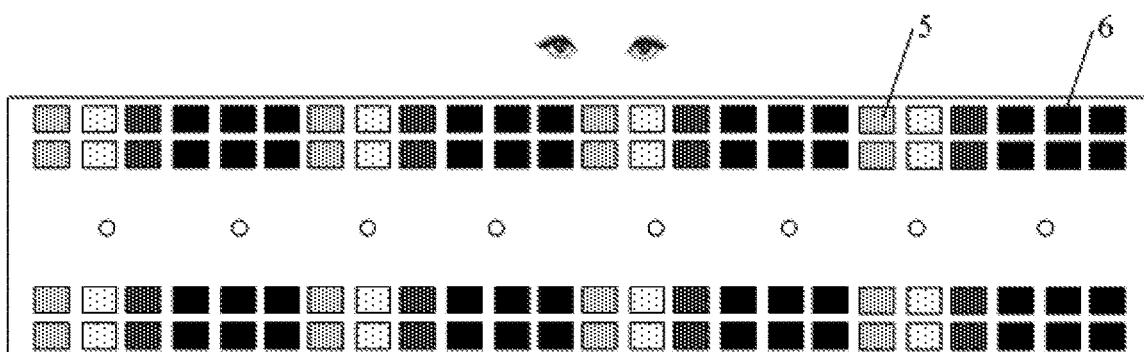
Figure 5A:
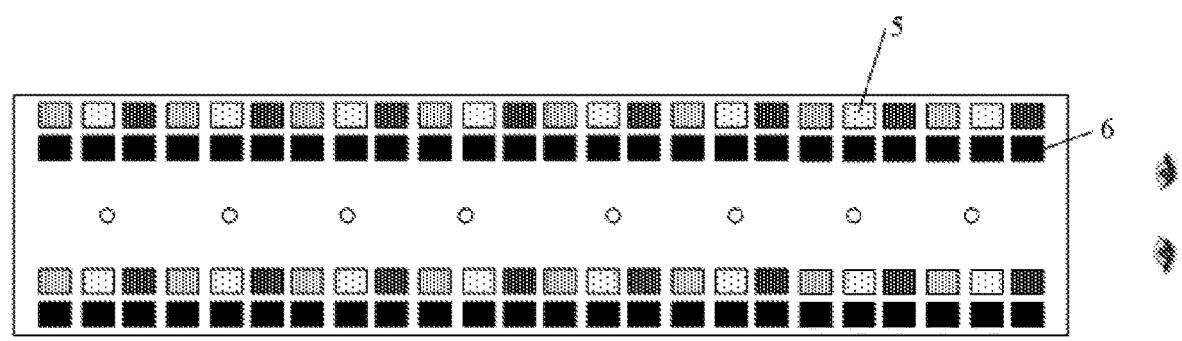
FIG. 5A and FIG. 5B are schematic diagrams illustrating another viewing manner of a 3D display panel in an embodiment of the present disclosure.
Figure 5B:
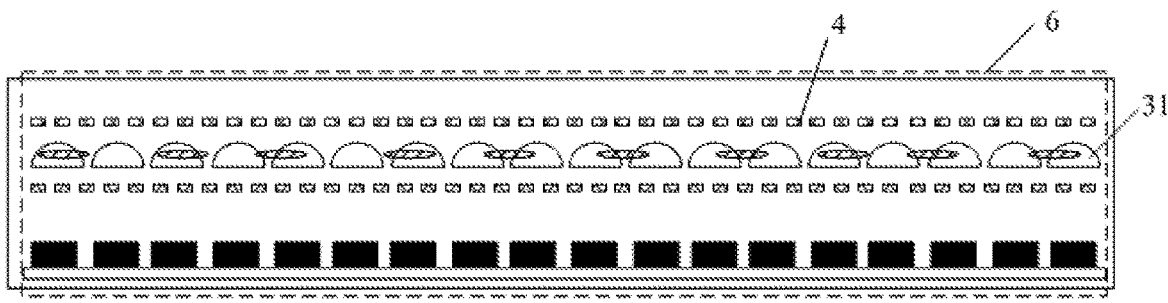
Figure 6A:
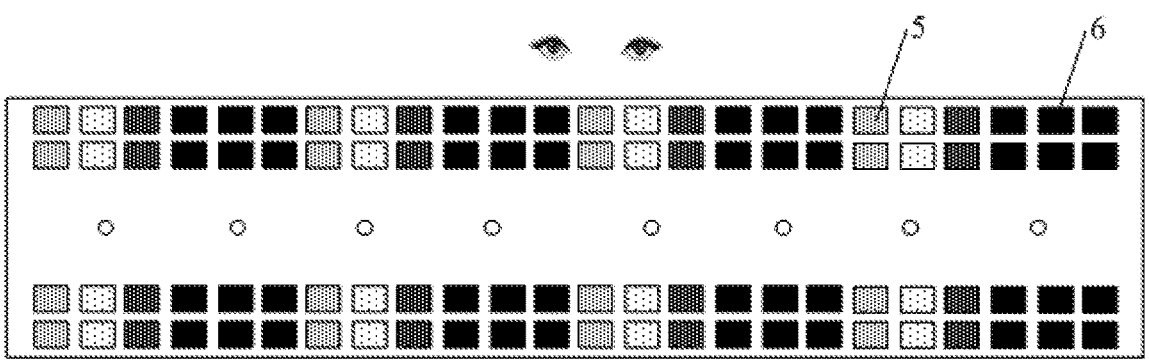
FIG. 6A and FIG. 6B are schematic diagrams illustrating still another viewing manner of a 3D display panel in an embodiment of the present disclosure.
Figure 6B:
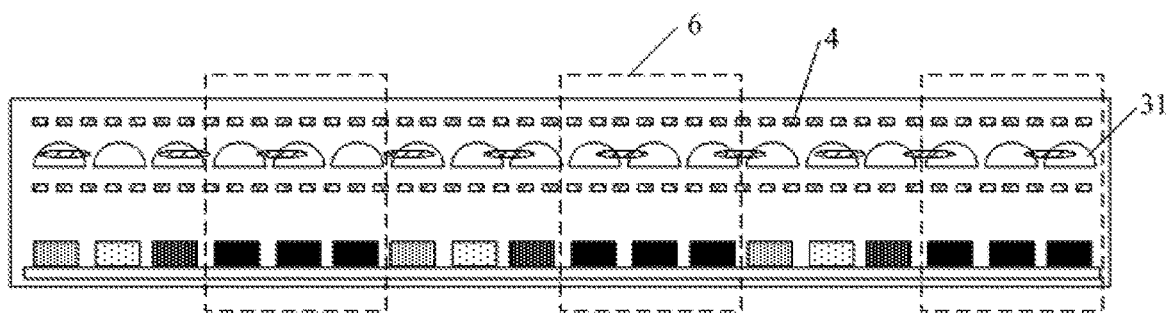
Figure 7A:
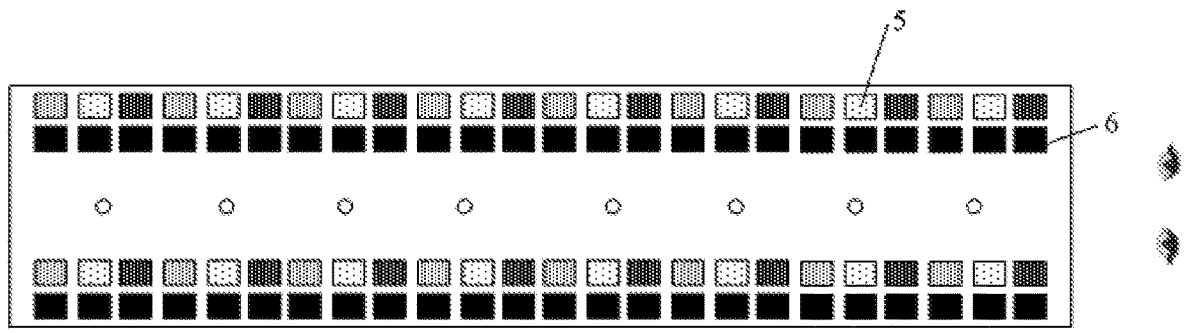
FIG. 7A and FIG. 7B are schematic diagrams illustrating yet another viewing manner of a 3D display panel in an embodiment of the present disclosure.
Figure 7B:
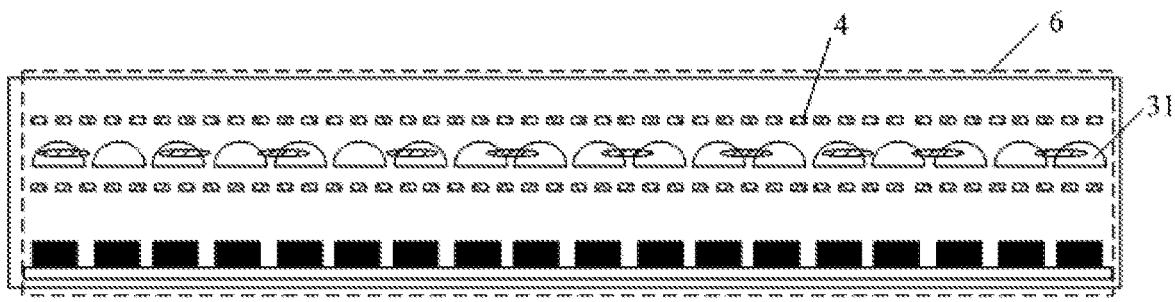

Hereinafter, the principle of implementing 3D display using the 3D display panel provided in the embodiment is described by taking a case where the 3D display panel uses red, green and blue uLEDs as an example. When viewing horizontally, for example, viewing horizontally in a landscape mode as shown in FIGS. 4A and 4B and viewing horizontally in a portrait mode as shown in FIGS. 6A and 6B, the uLED array is driven column by column, thus the uLEDs in some columns are in on state, and the uLEDs in the other columns are in off state, thereby forming a barrier pattern of alternating bright and dark bands (i.e., forming a parallax barrier). The uLEDs 6 in off state in the figure are shown in dashed boxes and in black. The uLEDs 6 in off state function as a black matrix BM for shielding light, and form a barrier together with the uLEDs in on state, thereby realizing 3D display. Similarly, when viewing vertically, for example viewing vertically in a landscape mode as shown in FIGS. 5A and 5B and viewing vertically in a portrait mode as shown in FIGS. 7A and 7B, the uLED array is driven row by row, thus the uLEDs in some rows are in on state, and the uLEDs in the other rows are in off state, thereby forming a barrier pattern of alternating bright and dark bands (i.e., forming a parallax barrier). The uLEDs 6 in off state function as a black matrix BM for shielding light, and form a barrier together with the uLEDs in on state, thereby realizing 3D display. In this case, the left and right eyes of a person receive different images, which are then synthesized in the brain to form an image with stereoscopic effects in directions of anterior-posterior, upper-lower, left-right, far-near, etc.

In the 3D display panel of the embodiments, the uLEDs have a high refresh rate (that can reach several kHz), and in practice, 3D display having a refresh rate of above 120 Hz can generally well separate the 3D image for the left eye from the 3D image for the right eye temporally. Therefore, in combination with the rapid response of the uLEDs and excellent controllability of the liquid crystal lenses, mutual crosstalk between images for the left and right eyes can be eliminated, and the controllability is good, so the 3D effect is greatly improved.

In some embodiments, the control electrodes are disposed on a same side of the display adjustment layer. For example, the control electrodes 4 are strip-shaped. Two groups of control electrodes 4, spaced apart from each other, in the control electrode layer are disposed on a same side of the display adjustment layer (and may be disposed in a same layer), and at least part of the control electrodes 4 are disposed correspondingly to the light emitting devices 2. The liquid crystal lenses 31 are formed and adjusted by controlling driving voltages applied to the control electrodes 4. In short, orientations of the liquid crystal molecules are controlled by the electrodes to form different refractive indexes in the liquid crystal, thereby forming liquid crystal lenses. In this case, the control electrode layer may only be disposed on the lower glass substrate, and an electric field is formed between adjacent control electrodes 4 in a same layer to deflect the corresponding liquid crystal material.

When the viewing direction is changed, the driving mode does not need to change. The viewer may view horizontally or vertically in a landscape mode, the specific imaging principle may refer to FIGS. 4A, 4B, 6A, and 6B, or may view horizontally or vertically in a portrait mode, and the specific imaging principle may refer to FIGS. 5A, 5B, 7A and 7B.

In the 3D display panel of the embodiments, the uLEDs have a high refresh rate (that can reach several kHz), and in practice, 3D display having a refresh rate of above 120 Hz can generally well separate the 3D image for the left eye from the 3D image for the right eye temporally. Therefore, in combination with the rapid response of the uLEDs and excellent controllability of the liquid crystal lenses, mutual crosstalk between images for the left and right eyes can be eliminated, and the controllability is good, so the 3D effect is greatly improved.

In another aspect, the present disclosure provides a method for driving the 3D display panel as described above, including steps of: driving the plurality of light emitting devices row by row or column by column such that the plurality of light emitting devices form a barrier pattern of alternating bright and dark bands.

In some embodiments, the plurality of light emitting devices may be driven row by row or column by column by a controller such that the plurality of light emitting devices form a barrier pattern of alternating bright and dark bands. As described above, the controller 7 may be disposed at a peripheral region of the 3D display panel, and the light emitting devices 2 in the pixel regions may be connected to the controller 7 through electrode lines 8, as shown in FIG. 8.

Because the light emitting devices in some rows (columns) are in on state, and the light emitting devices in the other rows (columns) are in off state, a barrier pattern of alternating bright and dark bands is formed. In this case, the light emitting devices in off state function as a black matrix (BM), so that 3D display is achieved through a parallax barrier.

For the description of the 3D display panel, reference may be made to the foregoing description, and details are not repeatedly described herein.

In yet another aspect, the present disclosure further provides a display apparatus including any one of the 3D display panels provided by the present disclosure.

For the description of the 3D display panel, reference may be made to the foregoing description, and details are not repeatedly described herein.

The display apparatus may be any product or component that has a display function such as an electronic paper, a cell phone, a tablet computer, a television, a display, a notebook computer, a digital photo frame, a navigator, or the like.

The display apparatus can provide a better 3D experience.

It should be understood that the above implementations are merely exemplary implementations for explaining the principle of the present disclosure, but the protection scope of the present disclosure is not limited thereto. For those skilled in the art, various variations and improvements may be made without departing from the spirit and essence of the present disclosure, and these variations and improvements shall also be regarded as falling into the protection scope of the present disclosure.

The invention claimed is:

1. A 3D display panel, divided into a plurality of pixel regions and comprising a light emitting unit and a display adjustment unit, the light emitting unit comprising a plurality of light emitting devices arranged in an array and respectively in the plurality of pixel regions, and the display adjustment unit being configured to control an exit direction of light emitted from the plurality of light emitting devices, wherein the plurality of light emitting devices are configured to form a barrier pattern of alternating bright and dark bands during display of the 3D display panel,
   the display adjustment unit comprises a display adjustment layer and a control electrode layer disposed on at least one side of the display adjustment layer, wherein:
   the display adjustment layer is a liquid crystal layer;
   the control electrode layer comprises a plurality of control electrodes spaced apart from each other, and the plurality of control electrodes are configured to drive liquid crystal in the liquid crystal layer to form a plurality of liquid crystal lenses under the action of voltages applied to the plurality of control electrodes, and adjust sizes and curvatures of the plurality of liquid crystal lenses by controlling the voltages applied to the plurality of control electrodes, so as to control the exit direction of the light emitted from the plurality of light emitting devices; and
   the plurality of light emitting devices are each a micro light emitting diode, and the plurality of liquid crystal lenses are in one-to-one correspondence with the plurality of light emitting devices.

2. The 3D display panel of claim 1, wherein the plurality of control electrodes each are strip-shaped, the plurality of control electrodes are symmetrically disposed on two sides of the display adjustment layer, and the control electrodes and the light emitting devices are disposed correspondingly.

3. The 3D display panel of claim 1, wherein the plurality of control electrodes each are strip-shaped, the plurality of control electrodes are disposed at intervals on a single side of the display adjustment layer, and at least part of the control electrodes are disposed correspondingly to the light emitting devices.

4. The 3D display panel of 1, wherein the liquid crystal layer is made of a twisted nematic liquid crystal, or an electrically controlled birefringence liquid crystal.

5. The 3D display panel of 1, further comprising a first controller disposed at a peripheral region of the 3D display panel, wherein the plurality of control electrodes are connected to the first controller through electrode lines, and the first controller is configured to control a voltage applied to each of the plurality of control electrodes such that the liquid crystal in the liquid crystal layer forms a plurality of liquid crystal lenses, and the sizes and curvatures of the plurality of liquid crystal lenses are adjusted.

6. The 3D display panel of claim 1, further comprising a second controller disposed at a peripheral region of the 3D display panel, the plurality of light emitting devices are connected to the second controller through electrode lines, and the second controller is configured to control the plurality of light emitting devices in the plurality of pixel regions to form a barrier pattern of alternating bright and dark bands.

7. The 3D display panel of claim 1, further comprising a plurality of gate lines and a plurality of data lines intersecting with each other and disposed between adjacent pixel regions, wherein each of the plurality of light emitting devices is connected to one of the plurality of gate lines and one of the plurality of data lines.

8. The 3D display panel of claim 1, wherein the micro light emitting diodes are monochromatic micro light emitting diodes, and the micro light emitting diodes having different colors are cyclically arranged in a row direction and a column direction.

9. The 3D display panel of claim 1, wherein the micro light emitting diodes are white micro light emitting diode devices.

10. The 3D display panel of claim 1, wherein the micro light emitting diodes are formed by a transfer method.

11. The 3D display panel of claim 10, wherein the micro light emitting diodes are formed on any one of a glass substrate, a polyester film substrate, and a printed circuit board.

12. A method for driving a 3D display panel, wherein the 3D display panel is the 3D display panel of claim 1, and the method comprises:
  driving the plurality of light emitting devices row by row or column by column such that the plurality of light emitting devices form a barrier pattern of alternating bright and dark bands.

13. The method of claim 12, wherein the plurality of light emitting devices are driven by a controller row by row or column by column such that the plurality of light emitting devices form a barrier pattern of alternating bright and dark bands.

14. A display apparatus, comprising the 3D display panel of claim 1.

15. The 3D display panel of claim 1, wherein the micro light emitting diode has a size of several tens of microns.

16. The 3D display panel of claim 1, wherein the micro light emitting diode has a refresh rate reaching several kHz.

* * * * *